United States Patent

Sakai et al.

[11] Patent Number: 5,122,483
[45] Date of Patent: Jun. 16, 1992

[54] METHOD OF FORMING A HIGHLY INSULATIVE THIN FILMS

[75] Inventors: Shigeki Sakai; Kiyoshi Ogata; Tsukasa Hayashi, all of Kyoto, Japan

[73] Assignee: Nissin Electric Company, Limited, Kyoto, Japan

[21] Appl. No.: 634,528

[22] Filed: Dec. 27, 1990

[30] Foreign Application Priority Data

Dec. 29, 1989 [JP] Japan .................................. 1-342776

[51] Int. Cl.$^5$ ............................................ H01L 21/02
[52] U.S. Cl. .................................. 437/238; 437/235; 437/243; 437/239; 437/244; 437/173
[58] Field of Search .............. 437/235, 243, 238, 239, 437/244, 173; 204/192.11, 192.25

[56] References Cited

U.S. PATENT DOCUMENTS

| | | | |
|---|---|---|---|
| 4,001,049 | 1/1977 | Baglin et al. | 437/173 |
| 4,483,725 | 11/1984 | Chang | 437/173 |
| 4,624,859 | 11/1986 | Akira et al. | 437/238 |
| 4,673,475 | 9/1991 | Windschmann | 204/192.11 |
| 4,776,925 | 10/1988 | Fossum et al. | 437/239 |

OTHER PUBLICATIONS

Ishikawa, "Low temperature formation . . . an ICB Source", Vacuum, vol. 39, No. 11-12, Apr. 1989, pp. 1111-1113.

Al-Jumaily et al., "Ion assisted deposition of oxynitrides of aluminum and silicon", J. Vac. Sci. Technol. A 7(3), May/Jun. 1989, pp. 2280-2285.

Minowa et al., "$SiO_2$ films deposited on Si by dual ion beams"; J. Vac. Sci. Technol. B 6(1), Jan./Feb. 1988, pp. 473-476.

Cuomo, "Step coverage during thin film deposition", IBM Tech. Disclosure Bulletin, vol. 24, No. 2, Jul. 1981, pp. 1077-1078.

Primary Examiner—Brian E. Hearn
Assistant Examiner—Trung Dang
Attorney, Agent, or Firm—Finnegan, Henderson, Farabow, Garrett & Dunner

[57] ABSTRACT

A method of forming a highly insulative silicon oxide thin film including the steps of providing a substrate, depositing silicon on the substrate, and injecting an ion beam of oxygen or a mixed gas consisting of oxygen and an inert gas simultaneously or alternately with the depositing of the silicon. Silicon oxide may be deposited on the substrate in combination with the injection of ions of an inert gas. Other metals made be deposited along with the injection of oxygen or nitrogen cations.

8 Claims, 1 Drawing Sheet

METHOD OF FORMING A HIGHLY INSULATIVE THIN FILMS

BACKGROUND OF THE INVENTION

1. Field of the Invention

This invention relates to a method of forming highly insulative thin films, and preferably silicon oxide thin films serving as a memory capacitor or capacitive insulator film on the surface of a semiconductor substrate or printed circuit board when fabricating large-scale integrated circuits (LSIs) and thin film capacitors.

2. Description of the Related Art

Silicon oxide ($SiO_2$) thin films have conventionally been formed on the surface of a substrate, such as a semiconductor substrate, by one of several methods. One method is vacuum evaporation wherein the silicon oxide thin film is formed by heating silicon oxide by an evaporation source to deposit the evaporation atoms on the surface of a substrate placed within a vacuum unit. Reactive vapor deposition is another method whereby a silicon oxide thin film is formed on the surface of a substrate by heating silicon that is an evaporation substance in an oxygen atmosphere to cause the oxygen to react with the silicon being deposited. Another method is ion beam sputtering by which silicon oxide thin film is formed on the surface of a substrate by injecting an ion beam of an inert gas onto a target material within a vacuum unit utilizing the sputtering effect. Finally, various chemical vapor deposition (CVD) methods such as plasma CVD and thermal CVD have been used.

The breakdown voltage measurements on silicon oxide thin films prepared by the above respective methods indicate such low values as shown by straight line A in FIG. 2. The maximum breakdown voltages are in the order of 10 MV/cm, and this has been an obstacle not only to increasing the capacitance of a thin film capacitor formed by having an electrode film and a silicon oxide film laminated one upon the other in thinner film form, but also to developing LSIs with a high withstanding voltage by which the silicon oxide thin film can operate stably at high voltages. The measured values shown by line A of FIG. 2 were obtained by measuring the circuit shown in FIG. 3. A substrate 11 and silicon oxide thin film 12 are separated by a circuit electrode formed on the surface of the substrate 11. An electrode film 14 is formed on the top surface of the thin film 12.

SUMMARY OF THE INVENTION

An object of the present invention is a method of forming highly insulative metal oxide thin films with a high dielectric breakdown voltage.

Another object of the present invention is a method of forming a highly insulative silicon oxide thin film with a high dielectric breakdown voltage.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the method of the present invention comprises the steps of providing a substrate, depositing silicon on the substrate, and injecting an ion beam of oxygen or a mixed gas consisting of oxygen and an inert gas simultaneously or alternately with the depositing of the silicon.

In another embodiment, the present invention contemplates a method of forming a highly insulative silicon oxide thin film comprising the steps of providing a substrate, depositing silicon oxide on the substrate, and injecting an ion beam of an inert gas simultaneously or alternately with the depositing of the silicon.

Still another aspect of the present invention is a method of forming a highly insulative metal oxide or metal nitride thin film comprising the steps of providing a substrate, depositing a metal on the substrate, and injecting an ion beam of gaseous ions simultaneously or alternately with the depositing of the metal.

BRIEF DESCRIPTION OF THE DRAWINGS

The accompanying drawings, which are incorporated in and constitute a part of this specification illustrate the manner in which the method of the present invention is practiced and, together with the description, serve to explain the objects, advantages and principles of the invention. In the drawings.

DETAILED DESCRIPTION

A first aspect of the present invention is to provide a method of forming a highly insulative silicon oxide thin film wherein an ion beam of oxygen or a mixed gas consisting essentially of oxygen and an inert gas is injected simultaneously or alternately with depositing silicon. According to a second aspect of the invention, an ion beam of an inert gas is injected simultaneously or alternately with depositing silicon oxide.

According to the method of forming a highly insulative silicon oxide thin film of the present invention, the molecules

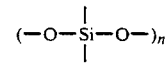

which constitute the silicon oxide thin film formed on the surface of the substrate, can be implanted at a high rate, and applying a high voltage which in turn causes the voltage applied to the other

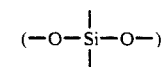

molecule to be reduced. In addition, a dislocation caused by atomic migration of the silicon oxide makes the thin film uniform and prevents the production of detrimental lattice defects.

Embodiments of the method of forming a highly insulative silicon oxide thin film according to the present invention will be described with reference to FIGS. 1 and 2.

EXAMPLE 1

Figure 1:
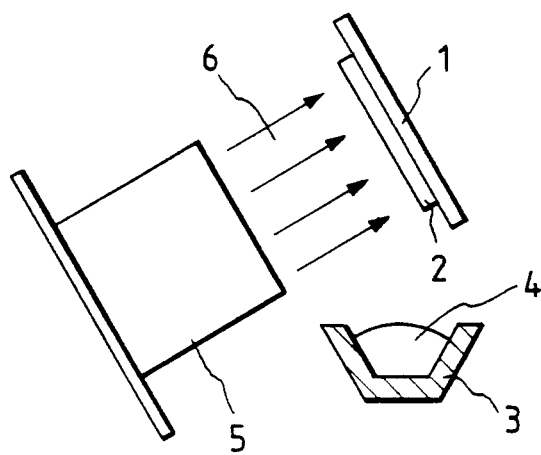
FIG. 1 is a schematic diagram showing a thin film forming device for explaining the method of forming highly insulative silicon oxide thin films according to the present invention.
Figure 2:
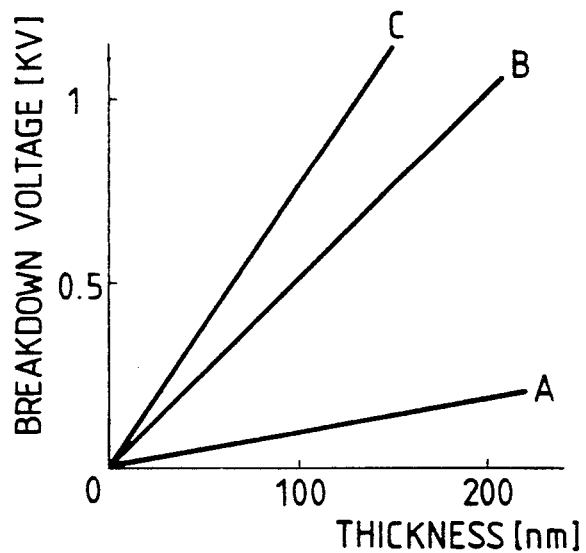
FIG. 2 is a graph showing the dielectric breakdown voltages of silicon oxide thin films prepared by the methods of the present invention and by a conventional method.

A high withstanding voltage silicon oxide film was formed on the surface of a semiconductor substrate using a device for forming a silicon oxide thin film as schematically shown in FIG. 1.

A substrate 2 is fixed on a holder 1 in a vacuum unit (not shown) that has been evacuated to $5 \times 10^{-4}$ Torr or more. This substrate 2 can be heated by a heating unit (not shown) disposed within the holder 1. Below the substrate 2 is an evaporation source 3 holding an evaporation substance 4 to be deposited on the surface of the substrate 2. An ion source 5 of the Kaufmann type or the bucket type using a cusp field is arranged at a position opposite of the substrate 2. The ion source 5 serves to inject an ion beam 6 of an ionized gas onto the surface of the substrate 2.

In the above construction, silicon (Si) was used as the evaporation substance 4, and was evaporated from the evaporation source 3 and deposited on the substrate 2 at room temperature simultaneously with injecting the ion beam 6 of ionized oxygen from the ion source 5 at an injection energy of 1 keV.

Figure 3:
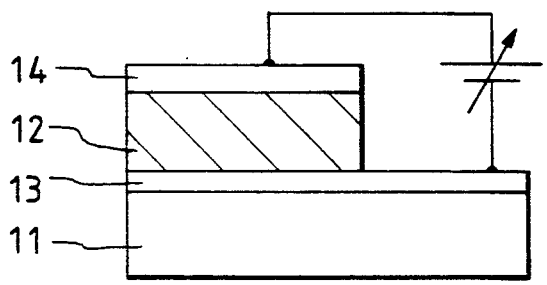
FIG. 3 is a schematic diagram showing a measuring circuit for measuring the dielectric breakdown voltage.

Various silicon oxide thin films of different thicknesses were prepared while maintaining the ratio of the amount of the evaporation substance 4 to the energy of the ion beam 6 constant and changing the treatment time. The dielectric breakdown voltages of these thin films were measured by the measuring circuit shown in FIG. 3. The result is shown by straight line B in FIG. 2. Since the dielectric breakdown voltages of the silicon oxide thin films formed on the surface of the substrate 2 are higher than for conventional processes, LSIs that can operate stably at higher voltages can be fabricated.

A mixed gas consisting of ionized oxygen and a noble gas may be injected as an ion beam. In this case, their mixing ratio should be adjusted so that the value x in SiOx of the silicon oxide thin film to be formed on the surface of the substrate 2 will be close to 2.

EXAMPLE 2

A silicon oxide thin film with a high withstanding (breakdown) voltage was formed on the surface of a semiconductor substrate in this example.

In a thin film forming device of the same construction as shown in FIG. 1, silicon oxide ($SiO_2$) was provide as an evaporation substance 4 and was evaporated from the evaporation source 3 and deposited on the semiconductor substrate 2 fixed on the holder 1 at room temperature. The process was performed simultaneously with the injection of an ion beam 6 of an ionized argon gas, which is an inert gas, at an injection energy of 1 keV. Various silicon oxide thin films of different thicknesses were prepared while maintaining the ratio of the amount of the evaporation substance 4 to the energy of the ion beam 6 constant and changing the treatment time. The results of the measurement of the corresponding dielectric breakdown voltages are shown by straight line C in FIG. 2. The dielectric breakdown voltages of the silicon oxide thin films formed on the surface of the substrate 2 are even higher than for Example 1, and LSIs that can operate stably at higher voltages can be fabricated.

Other applicable inert gases may include helium (He), neon (Ne), xenon (Xe), and krypton (Kr), and ion beam injection and vapor deposition may be alternated with each other repeatedly. Further, different combinations of the evaporation substance 4 and the ion beam 6, including $Si_3N_4$, $Ta_2O_5$, $Y_2O_3$, $Al_2O_3$ and AlN, selected to form improved thin films.

In the above examples, the injection energy of the ion beam 6 was 1 keV. Since high injection energies cause lattice defects to remain in the formed silicon oxide film, it is desirable to limit the injection energy to below 10 keV.

The method of forming a highly insulative silicon oxide thin film of the invention increases the filling rate of the silicon oxide molecules formed on the surface of the substrate, which in turn makes the thin film of consistent quality by leaving dislocations in the thin film uniform. This prevents the generation of lattice defects and allows the dielectric breakdown voltage of the silicon oxide thin film to be increased.

What is claimed is:

1. A method of forming a highly insulative silicon oxide thin film comprising the steps of:
   providing a substrate;
   depositing silicon on said substrate while said substrate is maintained at room temperature; and
   injecting an ion beam of oxygen or a mixed gas consisting essentially of oxygen and an inert gas simultaneously with the deposition of the silicon on said substrate, said ion beam having an energy approximately in the range of 1 KeV to 10 KeV.

2. A method of forming a highly insulative silicon oxide thin film comprising the steps of:
   providing a substrate;
   depositing silicon oxide on said substrate while said substrate is maintained at room temperature; and
   injecting an ion beam of an inert gas simultaneously with the deposition of the silicon oxide on said substrate, said ion beam having an energy approximately in the range of 1 KeV to 10 KeV.

3. The method according to claim 2, wherein the step of injecting includes injecting an ion beam of argon.

4. The method according to claim 2, wherein the step of injecting includes injecting an ion beam of one selected from the group consisting of helium, neon, xenon, and krypton.

5. A method of forming a highly insulative silicon oxide thin film comprising the steps of:
   providing a substrate;
   depositing silicon on said substrate while said substrate is maintained at room temperature; and
   injecting an ion beam of oxygen or a mixed gas consisting essentially of oxygen and an inert gas alternately with the deposition of the silicon on said substrate, said ion beam having an energy approximately in the range of 1 KeV to 10 KeV.

6. A method of forming a highly insulative silicon oxide thin film comprising the steps of:
   providing a substrate;
   depositing silicon oxide on said substrate while said substrate is maintained at room temperature; and
   injecting an ion beam of an inert gas alternately with the deposition of the silicon oxide on said substrate, said ion beam having an energy approximately in the range of 1 KeV to 10 KeV.

7. The method according to claim 6, wherein the step of injecting includes an ion beam of argon.

8. The method according to claim 6, wherein the step of injecting includes an ion beam of one selected from the group consisting of helium, neon, xenon, and krypton.

* * * * *